(12) United States Patent
Kanki et al.

(10) Patent No.: US 7,842,614 B2
(45) Date of Patent: Nov. 30, 2010

(54) METHOD FOR MANUFACTURING SEMICONDUCTOR DEVICE AND POLISHER USED IN THE METHOD FOR MANUFACTURING SEMICONDUCTOR DEVICE

(75) Inventors: Tsuyoshi Kanki, Kawasaki (JP);
Takahiro Kimura, Kawasaki (JP);
Tetsuya Shirasu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 11/968,933

(22) Filed: Jan. 3, 2008

(65) Prior Publication Data
US 2008/0166877 A1    Jul. 10, 2008

(30) Foreign Application Priority Data

Jan. 4, 2007 (JP) .............................. 2007-000161
Aug. 8, 2007 (JP) .............................. 2007-206222

(51) Int. Cl.
*H01L 21/302* (2006.01)
*H01L 21/461* (2006.01)
*B24B 1/00* (2006.01)
*C03C 15/00* (2006.01)

(52) U.S. Cl. .................... 438/693; 451/28; 216/89; 257/E21.23

(58) Field of Classification Search .............. 438/693; 451/28, 35, 89
See application file for complete search history.

(56) References Cited

U.S. PATENT DOCUMENTS

| | | | | |
|---|---|---|---|---|
| 6,066,028 | A * | 5/2000 | Cheng et al. | ................ 451/28 |
| 6,565,736 | B2 | 5/2003 | Park et al. | |
| 6,722,942 | B1 * | 4/2004 | Lansford et al. | ............... 451/5 |
| 2004/0178059 | A1 * | 9/2004 | Lee | .................. 204/224 M |
| 2005/0218009 | A1 * | 10/2005 | Huo et al. | .................. 205/663 |
| 2005/0266689 | A1 * | 12/2005 | Small et al. | ................ 438/693 |
| 2007/0173056 | A1 * | 7/2007 | Kodera | .................. 438/633 |

FOREIGN PATENT DOCUMENTS

| | | |
|---|---|---|
| JP | 2002-146574 A | 5/2002 |
| JP | 2003-136406 A | 5/2003 |
| JP | 2004-063996 A | 2/2004 |
| JP | 3578263 B2 | 10/2004 |
| JP | 2004-363464 A | 12/2004 |

\* cited by examiner

*Primary Examiner*—W. David Coleman
(74) *Attorney, Agent, or Firm*—Fujitsu Patent Center

(57) ABSTRACT

A method for manufacturing a semiconductor device, including depositing an interconnect material including Cu or Cu alloy over an insulating film, and polishing the interconnect material by CMP with a polishing liquid, wherein the oxidation-reduction potential (ORP) of the polishing liquid is controlled so as to be in the range of 400 mV to 700 mV vs. Ag/AgCl.

17 Claims, 8 Drawing Sheets

Prior Art

Prior Art

Cap film of approx 30nm in thickness

Prior Art

METHOD FOR MANUFACTURING SEMICONDUCTOR DEVICE AND POLISHER USED IN THE METHOD FOR MANUFACTURING SEMICONDUCTOR DEVICE

CROSS-REFERENCE TO RELATED APPLICATIONS

This application is based upon and claims the benefits of the priority from the prior Japanese Patent Application Nos. 2007-000161 filed on Jan. 4, 2007 and 2007-206222 filed on Aug. 8, 2007, the entire contents of which are incorporated herein by reference.

BACKGROUND OF THE INVENTION

1. Field of the Invention

The present invention relates to a method for manufacturing a semiconductor device which is provided with a highly integrated LSI interconnection, and a polisher used in the method for manufacturing such semiconductor device.

2. Description of the Related Art

Cu interconnections, which are low in resistance and high in electromigration resistance, are used as CMOS-LSI interconnect materials that are being made minute and high in speed. As opposed to Al interconnections which are conventionally used, Cu interconnections are difficult to dry-etch; accordingly, a damascene process for forming an opening portion (an interconnect groove (trench) and a via hole) in an insulating film and a dual damascene process (in which a trench and a via hole are integrally formed) have been developed, and Cu interconnections are formed by these processes (as in Japanese Patent Application Laid-Open (JP-A) Nos. 2004-63996 and 2004-363464, for example).

For example, an interconnection forming method for an interconnect structure whose minimum via hole/trench diameter is 90 nm will be briefly described. An interconnect structure in which the thickness of an interconnect first layer portion (interlayer thickness) is 440 nm and the minimum via hole/trench diameter is 90 nm is formed by a single damascene process or a dual damascene process (FIG. 2A). Then a barrier metal is formed to prevent Cu from spreading onto an insulating film (FIG. 2B), and a Cu seed functioning as an electrode is formed by a PVD method (sputtering method) or a CVD method (FIG. 2C). The thickness of the barrier metal is set at approximately 5 nm to 20 nm, and the thickness of the Cu seed set at approximately 40 nm to 120 nm. Afterward, the interconnect structure undergoes electrolytic plating in a copper sulfate plating solution such that a Cu plate is deposited until it becomes 0.4 µm to 2 µm or so in thickness, and Cu is embedded in a via hole/trench (FIG. 2D). Subsequently, an unnecessary Cu layer is removed by means of chemical-mechanical polishing (CMP) which consists of two elements that are Cu dissolution (chemical) utilizing chemical reaction, and physical polishing (mechanical) (FIG. 2E). After that, an interconnect layer is capped with a cap film, thereby forming one complete layer (FIG. 2F). This process is later repeated to form a multi-layered structure.

When an interconnection is formed by polishing a Cu film in accordance with the chemical-mechanical polishing (CMP), improvement in Cu film polishing rate is a major object to achieve in order to improve throughput and reduce costs. Also, stable polishing techniques are necessary in order to limit failure caused by variation in polishing rate, decrease in yield and defects such as corrosion.

However, if a slurry containing hydrogen peroxide ($H_2O_2$) as an oxidant and a slurry containing ammonium persulfate (APS) as an oxidant are used for polishing liquids, the slurry containing hydrogen peroxide ($H_2O_2$) decreases in Cu film polishing rate when the slurry is alkaline (as shown in FIG. 3, the polishing rate is 220.7 nm/min when pH=3, whereas the polishing rate is 0 nm/min to 1 nm/min when pH=9), and the slurry containing ammonium persulfate (APS) decreases in Cu film polishing rate when the slurry is acid (as shown in FIG. 3, the polishing rate is 73.9 nm/min when pH=9, whereas the polishing rate is 19.7 nm/min when pH=3). Accordingly, an attempt was made to control the Cu film polishing rate by controlling the pH of a slurry; however, simply controlling the pH of the slurry can cause the Cu film polishing rate to decrease.

Additionally, polishing capacity of a slurry has already been maintained by keeping the oxidation-reduction potential, electric conductivity, abrasive grain concentration, etc. of the slurry within a certain range (as in JP-A No. 2003-136406, for example).

BRIEF SUMMARY OF THE INVENTION

A method for manufacturing a semiconductor device including depositing an interconnect material including Cu or Cu alloy over an insulating film, and polishing the interconnect material by CMP with a polishing liquid, wherein the oxidation-reduction potential (ORP) of the polishing liquid is controlled so as to be in the range of 400 mV to 700 mV vs. Ag/AgCl.

DETAILED DESCRIPTION OF THE INVENTION

Figure 1:
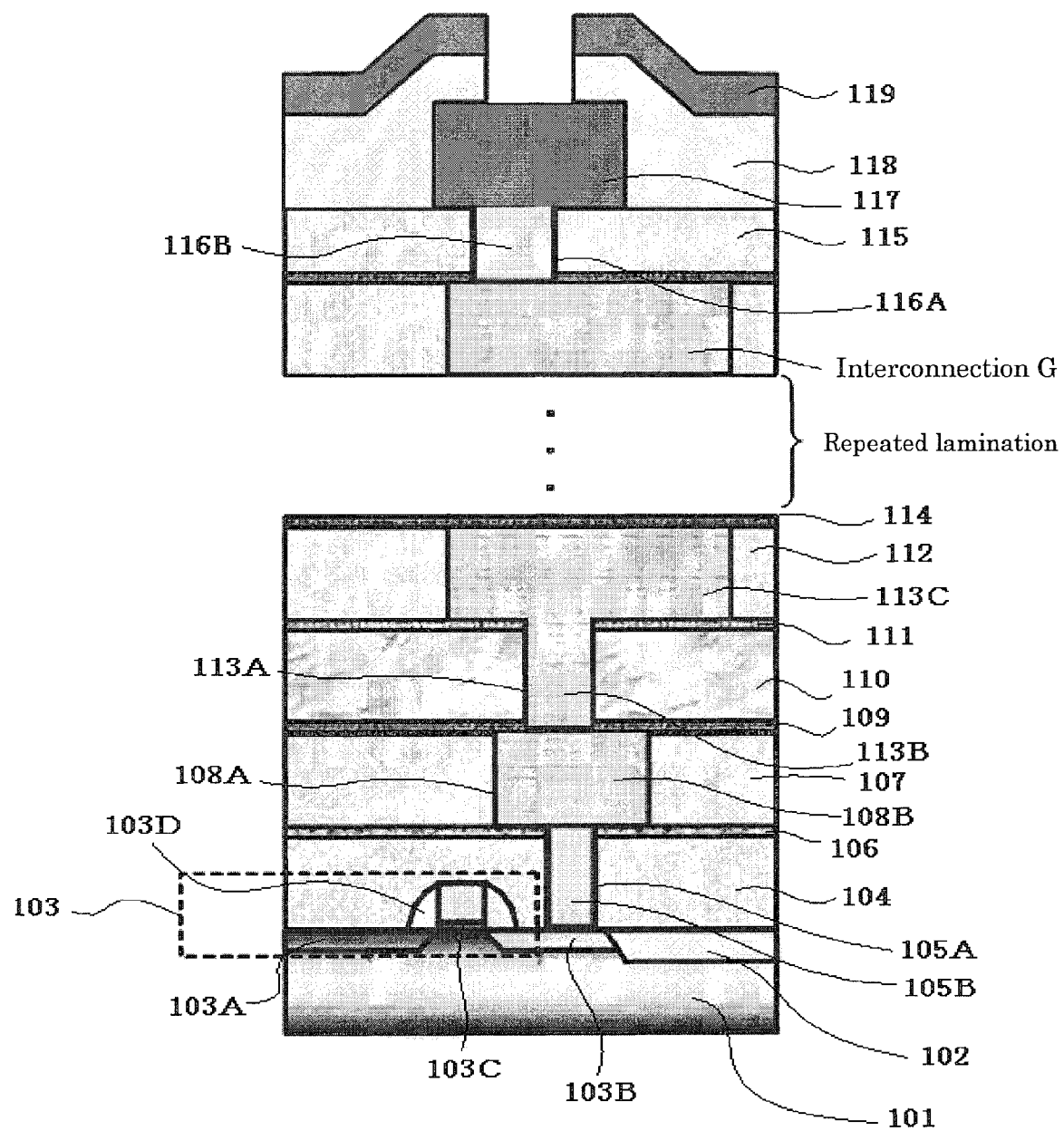
FIG. 1 is an explanatory diagram of a semiconductor device manufactured by a method for manufacturing a semiconductor device.

The present inventors obtained the following pieces of knowledge: knowledge that when the oxidation-reduction potential (ORP) of a slurry containing hydrogen peroxide ($H_2O_2$) or ammonium persulfate (APS) as an oxidant is controlled so as to be in the range of 400 mV to 700 mV vs. Ag/AgCl, the Cu film dissolution rate can be increased to 100 nm/min or greater (after-mentioned FIGS. 8 and 9); and knowledge that when a slurry whose oxidation-reduction potential (ORP) is in the vicinity of 400 mV vs. Ag/AgCl or in the vicinity of 700 mV vs. Ag/AgCl is used for dissolving a Cu film, there is a possibility that the oxidation-reduction potential (ORP) of the slurry after used for dissolving the Cu film may go outside the range of 400 mV to 700 mV vs. Ag/AgCl (after-mentioned Table 1), affected for example by reaction between impurities in the Cu film and Cu ions, and thus it is necessary to control the oxidation-reduction potential (ORP) of the slurry so as to be in the range of 400 mV to 700 mV vs. Ag/AgCl.

As to the method for manufacturing a semiconductor device, since the interconnect material formed of Cu or Cu alloy is deposited on the insulating film, it is possible to form the interconnect material on the insulating film. Also, since the deposited interconnect material is polished by CMP with a polishing liquid, it is possible to remove unnecessary parts in the deposited interconnect material. In addition, since the oxidation-reduction potential (ORP) of the polishing liquid is measured, and the oxidation-reduction potential (ORP) of the polishing liquid measured is controlled so as to be in the range of 400 mV to 700 mV vs. Ag/AgCl, it is possible to increase the dissolution rate of the interconnect material formed of Cu or Cu alloy to 100 nm/min or greater and thus to improve the chemical-mechanical polishing rate of the interconnect material formed of Cu or Cu alloy.

A polisher is a polisher which polishes an interconnect material formed of Cu or Cu alloy deposited on an insulating film by CMP with a polishing liquid, including a polishing liquid vessel configured to store the polishing liquid, a polishing liquid supplying unit configured to supply the polishing liquid in the polishing liquid vessel to the interconnect material, a measuring unit configured to measure the oxidation-reduction potential (ORP) of the polishing liquid, and a chemical solution supplying unit configured to supply a chemical solution when the oxidation-reduction potential (ORP) of the polishing liquid measured by the measuring unit is outside the range of 400 mV to 700 mV vs. Ag/AgCl.

As to the polisher, since the polishing liquid in the polishing liquid vessel is supplied to the interconnect material by the polishing liquid supplying unit, it is possible to remove unnecessary parts in the deposited interconnect material by means of chemical-mechanical polishing. Also, since the chemical solution is supplied by the chemical solution supplying unit when the oxidation-reduction potential (ORP) of the polishing liquid measured by the measuring unit is outside the range of 400 mV to 700 mV vs. Ag/AgCl, it is possible to adjust the oxidation-reduction potential (ORP) of the polishing liquid efficiently.

It is possible to provide a method for manufacturing a semiconductor device capable of solving problems in related art, in which the dissolution rate of an interconnect material formed of Cu or Cu alloy can be increased to 100 nm/min or greater and thus the chemical-mechanical polishing rate of the interconnect material formed of any one of Cu and Cu alloy can be improved, and a polisher used in the method for manufacturing such semiconductor device.

(Method for Manufacturing Semiconductor Device)

A method for manufacturing a semiconductor device includes a depositing step and a polishing step, and further includes other steps suitably selected according to necessity.

—Semiconductor Device—

A schematic cross-sectional view of a semiconductor device is shown in FIG. 1. An element separation insulating film 102 having a shallow trench isolation (STI) structure is formed at a surface layer portion of a semiconductor substrate 101 formed of silicone, where an active region is demarcated. In this active region, an MOS transistor 103 is formed. The MOS transistor 103 has a source region 103A, a drain region 103B, a gate insulating film 103C and a gate electrode 103D.

An interlayer insulating film 104 (whose thickness is 300 nm, for example) made of silicon oxide and a protective film 106 (whose thickness is 50 nm, for example) made of SiOC are formed in such a manner as to cover the MOS transistor 103 formed on the semiconductor substrate 101.

When a via hole which penetrates through the protective film 106 and the interlayer insulating film 104 is formed, a part of the surface of the drain region 103B is exposed at the bottom of the via hole. A conductive plug 105B made of tungsten (W) is formed in this via hole. A barrier metal layer 105A (whose thickness is 25 nm, for example) made of TiN is formed between the conductive plug 105B and the inner surface of the via hole. The above-mentioned structure can be formed by means of conventional photolithography, etching, chemical vapor deposition (CVD), chemical-mechanical polishing (CMP), etc.

An interlayer insulating film 107 is formed on the protective film 106. In the interlayer insulating film 107, an interconnect groove which reaches the bottom surface thereof and passes above the conductive plug 105B is formed, and a first-layer interconnection 108B is formed in this interconnect groove. The interconnection 108B is prevented by a barrier metal 108A from spreading to an interlayer film. And the interconnection 108B is formed of copper or copper alloy and connected to the conductive plug 105B. A cap film 109, a via layer interlayer insulating film 110, an etching stopper film 111 and an interconnect layer interlayer insulating film 112 are laid on top of one another in this order on the interlayer insulating film 107.

An interconnect groove and a via hole are formed in the interconnect layer interlayer insulating film 112 and the via layer interlayer insulating film 110 by a dual damascene process. The interconnect groove reaches the upper surface of the etching stopper film 111. The via hole is made in the bottom of the interconnect groove and reaches the upper surface of the interconnection 108B thereunder, penetrating through the etching stopper film 111. The interconnect groove and the via hole are filled with conductive members 113C and 113B formed of copper or copper alloy. The conductive member 113C with which the interconnect groove is filled is connected to the first-layer interconnection 108B. Also, the conductive member (interconnection/via) is prevented by a barrier metal 113A from spreading to an interlayer film. Note that the interconnection 108B and the conductive member 113C are formed in an after-mentioned polishing step by being polished with a polishing liquid whose oxidation-reduction potential (ORP) is controlled so as to be in the range of 400 mV to 700 mV vs. Ag/AgCl.

A cap film 114 is laid on the interconnect layer interlayer insulating film 112, and subsequently one structure including the cap film 109 to the conductive members 113B and 113C is repeatedly deposited on another to constitute a layered interconnection.

A multi-layered interconnection is formed, an interlayer insulating film 115 is laid thereupon, a conductive plug 116B (formed of W, for example) and a barrier metal 116A (formed of TiN, for example) are formed in the insulating film to provide connection to a lower interconnect layer, a pad 117 (formed of Al, for example) is formed thereupon, and the pad 117 is covered by interlayer insulating films 118 and 119 (500 nm or so in thickness); a semiconductor device is thus formed.

—Depositing Step—

The aforesaid depositing step is not particularly limited except that an interconnect material formed of Cu or Cu alloy is deposited on an insulating film, and a suitable depositing step can be selected for the aforesaid depositing step according to the purpose.

A suitable insulating film can be selected for the aforesaid insulating film according to the purpose, without its shape, structure, size, material, etc. being particularly limited. The material for the aforesaid insulating film is not particularly limited, and a suitable material can be selected according to the purpose; examples thereof include low dielectric constant (low-k) materials such as $SiO_2$, SiOF, Si—H contained $SiO_2$, porous silica film, carbon-contained $SiO_2$ film (SiOC), methyl group contained $SiO_2$ (MSQ), porous MSQ, polymeric film (polyimide-based film, parylene-based film, TEFLON (registered trademark) based film, etc.) and amorphous carbon (e.g. fluorine-doped amorphous carbon).

For the aforesaid interconnect material, a suitable interconnect material can be selected according to the purpose without its shape, structure, size, etc. being particularly limited, as long as it is formed of Cu or Cu alloy.

—Polishing Step—

Figure 4:
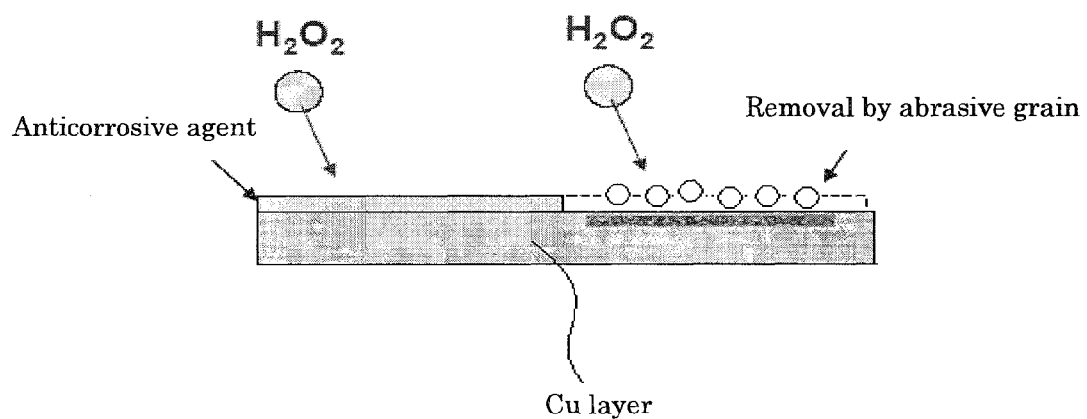
FIG. 4 is an explanatory diagram of chemical-mechanical polishing in a CMP step.

The aforesaid polishing step is not particularly limited except that a deposited interconnect material is polished by CMP with a polishing liquid, a chemical solution is supplied when the oxidation-reduction potential (ORP) of the polishing liquid measured is outside the range of 400 mV to 700 mV vs. Ag/AgCl, and the amount of the chemical solution supplied is controlled such that the oxidation-reduction potential (ORP) of the polishing liquid is in the range of 400 mV to 700 mV vs. Ag/AgCl; and a suitable polishing step can be selected for the aforesaid polishing step according to the purpose. For example, the aforesaid polishing step may be composed of a plurality of polishing steps, and the oxidation-reduction potential, pH, composition, etc. of a polishing liquid may vary according to each polishing step. Note that the chemical-mechanical polishing consists of Cu film dissolution by means of an oxidant and a dissolving agent (chemical element) and physical polishing by means of abrasive grain (mechanical element), as shown in FIG. 4.

Additionally, it is desirable to measure the oxidation-reduction potential (ORP) of a polishing liquid before used for chemical-mechanical polishing of a deposited interconnect material and the oxidation-reduction potential (ORP) of the polishing liquid after used for the chemical-mechanical polishing.

For the aforesaid polishing liquid, a suitable polishing liquid can be selected according to the purpose without its composition, etc. being particularly limited, as long as it can polish a deposited interconnect material by CMP. Examples of the aforesaid polishing liquid contain: oxidants such as ammonium persulfate (APS), hydrogen peroxide ($H_2O_2$), and the like; dissolving agents (complexing agents) such as tri-ammonium citrate, malic acid, and the like; surfactants; anti-corrosive agents such as benzotriazole (BTA), benzimidazole, and the like; and abrasive grain.

The aforesaid chemical solution is not particularly limited as long as it is capable of adjusting the value of the oxidation-reduction potential (ORP) of a polishing liquid used for chemical-mechanical polishing, and a suitable chemical solution can be selected for the aforesaid chemical solution according to the purpose; examples thereof include a chemical solution having the same components as those of a polishing liquid, and chemical solutions containing sulfur compounds (such as sodium mercaptopropanesulfonate), iron compounds (such as compounds which dissociate $Fe^{3+}$), etc.

—Other Steps—

Figure 2A:
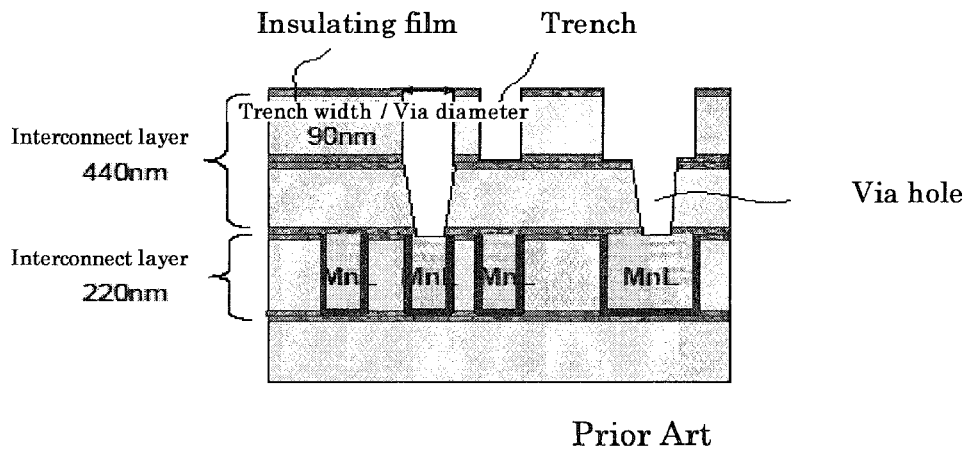
FIG. 2A is an explanatory diagram of an opening portion forming step configured to form an opening portion in an insulating film.
Figure 2B:
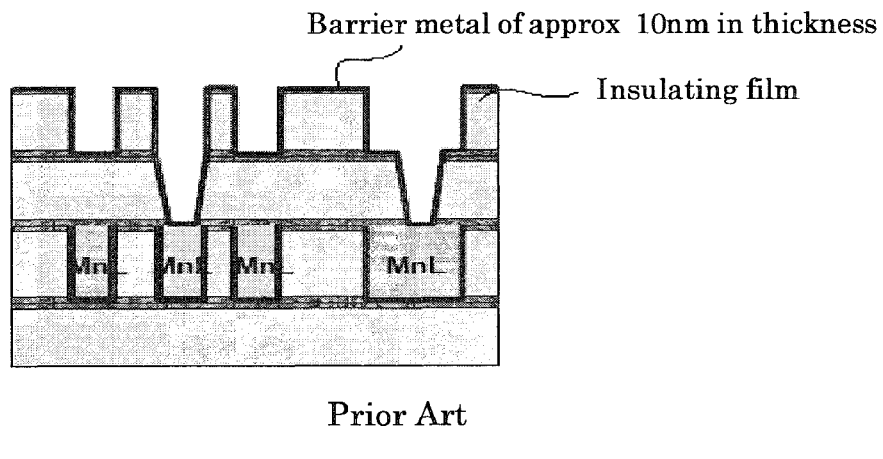
FIG. 2B is an explanatory diagram of a barrier metal forming step configured to form a barrier metal.
Figure 2C:
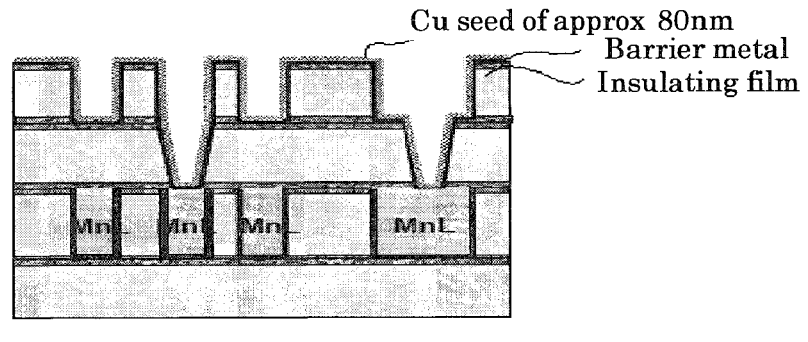
FIG. 2C is an explanatory diagram of a Cu seed forming step configured to form a Cu seed.
Figure 2D:
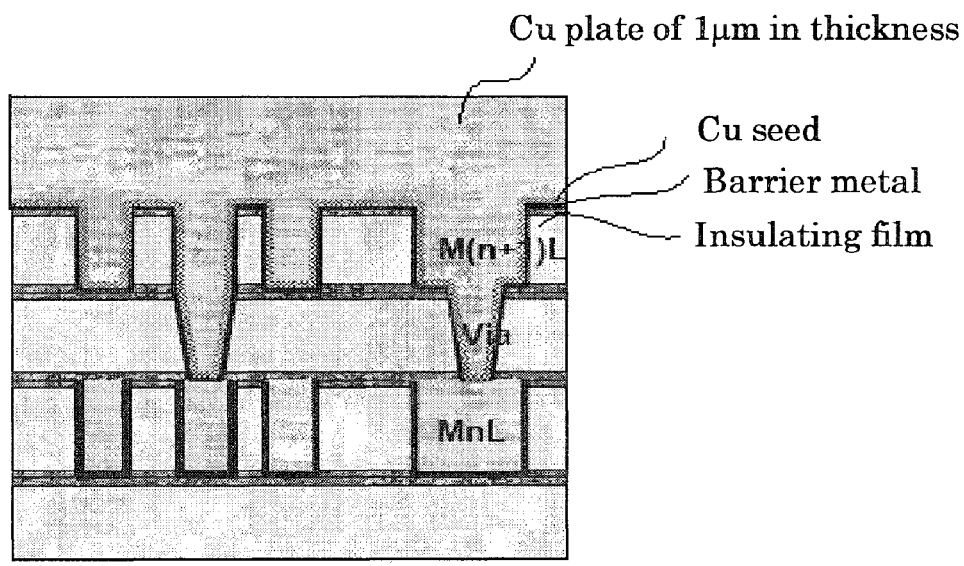
FIG. 2D is an explanatory diagram of a Cu plating step configured to plate an interconnect structure with Cu.
Figure 2E:
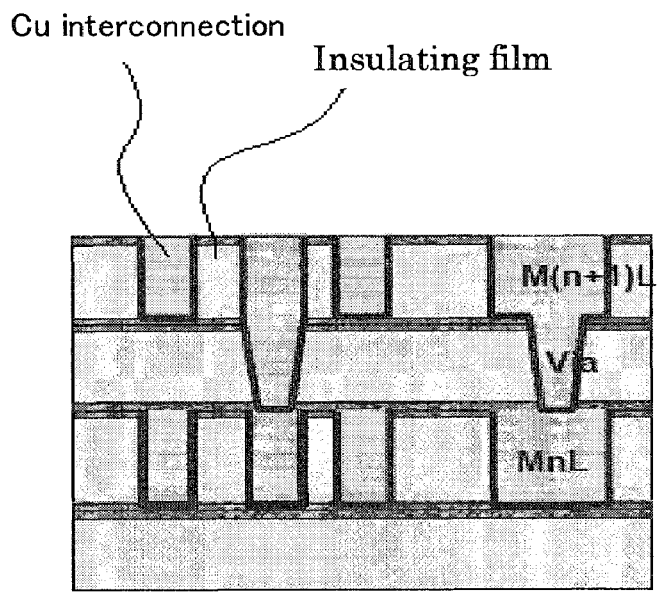
FIG. 2E is an explanatory diagram of a CMP step configured to remove a Cu layer which is unnecessary for interconnection, by means of chemical-mechanical polishing (CMP).
Figure 2F:
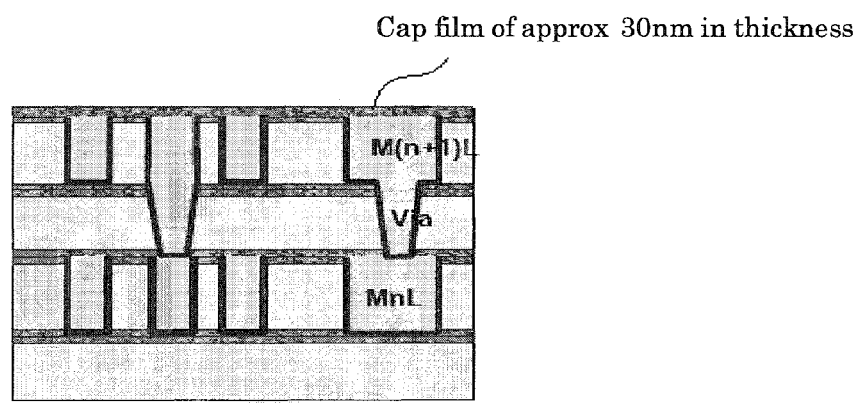
FIG. 2F is an explanatory diagram of a capping step configured to cap a Cu interconnect layer with a cap film.
Figure 3:
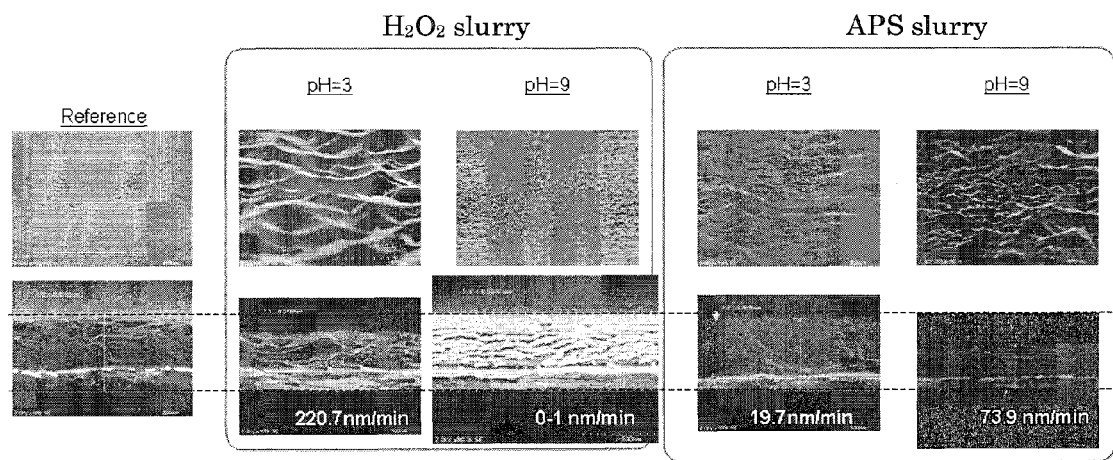
FIG. 3 is an explanatory diagram of the pH dependence with respect to the Cu film polishing rate, when a slurry containing hydrogen peroxide ($H_2O_2$) or ammonium persulfate (APS) as an oxidant is used.

The aforesaid other steps are not particularly limited as long as they do not impair the effects of the present invention, and suitable steps can be selected for the aforesaid other steps according to the purpose; examples thereof include an opening portion forming step configured to form an opening portion (a trench and a via hole) in an insulating film, a barrier metal depositing step configured to deposit a barrier metal on the insulating film in which the opening portion has been formed, a Cu seed forming step (FIG. 2C) configured to form a Cu seed functioning as an electrode by a PVD method (sputtering method) or a CVD method, a removal step configured to remove the insulating film and the barrier metal after the polishing step, a washing step configured to provide a wash after the insulating film and the barrier metal have been removed, and a cap film forming step (FIG. 2F) configured to cap an interconnect layer with a cap film.

A suitable barrier metal can be selected for the aforesaid barrier metal according to the purpose, without its shape, structure, size, material, etc. being particularly limited. The material for the aforesaid barrier metal is not particularly limited, and a suitable material can be selected according to the purpose; examples thereof include Ta, Ti, W, Zr, Ru and nitrides thereof.

A suitable cap film can be selected for the aforesaid cap film according to the purpose, without its shape, structure, size, material, etc. being particularly limited. The material for the aforesaid cap film is not particularly limited, and a suitable material can be selected according to the purpose; examples thereof include SiC, SiO, SiOC, SiO+SiC and SiN.

(Polisher)

A polisher of the present invention includes a polishing liquid vessel configured to store a polishing liquid, a polishing liquid supplying unit configured to supply the polishing liquid in the polishing liquid vessel to an interconnect material, a measuring unit configured to measure the oxidation-reduction potential (ORP) of the polishing liquid, and a chemical solution supplying unit configured to supply a chemical solution when the oxidation-reduction potential (ORP) of the polishing liquid measured by the measuring unit is outside the range of 400 mV to 700 mV vs. Ag/AgCl, and further, includes other units suitably selected according to necessity.

Figure 5:
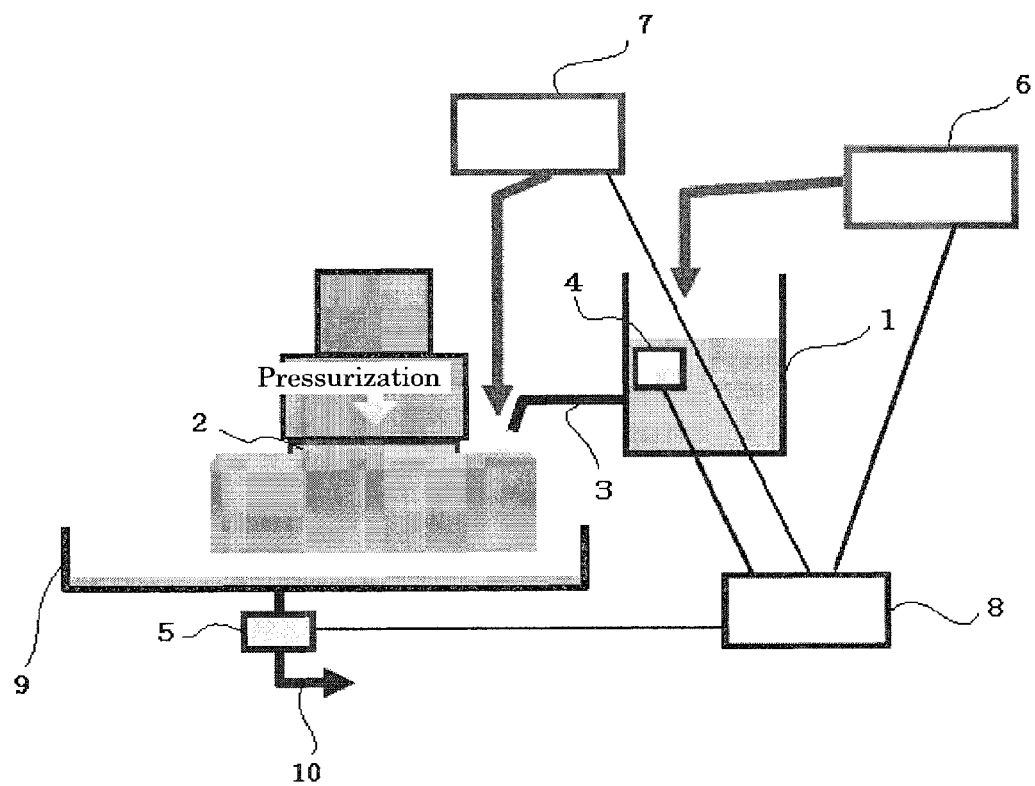
FIG. 5 is a schematic explanatory diagram showing the structure of a polisher.

For example, as shown in FIG. 5, the polisher includes a polishing liquid vessel 1 configured to store a polishing liquid, a polishing liquid supplying unit 3 configured to supply the polishing liquid in the polishing liquid vessel 1 to an interconnect material on a wafer 2, measuring units 4 and 5 configured to measure the oxidation-reduction potential (ORP) of polishing liquids, chemical solution supplying units 6 and 7 configured to supply chemical solutions when the oxidation-reduction potential (ORP) of the polishing liquids measured by the measuring units 4 and 5 is outside the range of 400 mV to 700 mV vs. Ag/AgCl, and a chemical solution supply controlling unit 8 configured to control the amount of the chemical solutions supplied by the chemical solution supplying units 6 and 7 such that the oxidation-reduction potential (ORP) of the polishing liquids is in the range of 400 mV to 700 mV vs. Ag/AgCl.

—Polishing Liquid Vessel—

For the polishing liquid vessel 1, a suitable polishing liquid vessel can be selected according to the purpose without its shape, structure, size, material, etc. being particularly limited, as long as it can store a polishing liquid.

—Polishing Liquid Supplying Unit—

For the polishing liquid supplying unit 3, a suitable polishing liquid supplying unit can be selected according to the purpose without its shape, structure, size, material, etc. being particularly limited, as long as it can supply a polishing liquid in the polishing liquid vessel 1 to the interconnect material on the wafer 2.

—Measuring Unit—

For the measuring units 4 and 5, suitable measuring units can be selected according to the purpose without their shape, structure, size, material, etc. being particularly limited, as long as they can measure the oxidation-reduction potential (ORP) of polishing liquids. The measuring units 4 and 5 are, for example, constructed of a first sensor 4 configured to measure the oxidation-reduction potential (ORP) of a polishing liquid (polishing liquid before used for chemical-mechanical polishing of the interconnect material on the wafer 2) in the polishing liquid vessel 1, and a second sensor 5 configured to measure the oxidation-reduction potential (ORP) of the polishing liquid (polishing liquid after used for the chemical-mechanical polishing of the interconnect material on the wafer 2) in a polishing liquid collecting container 9.

—Chemical Solution Supplying Unit—

The chemical solution supplying units 6 and 7 are not particularly limited as long as they can supply chemical solutions when the oxidation-reduction potential (ORP) of polishing liquids measured by the measuring units 4 and 5 is outside the range of 400 mV to 700 mV vs. Ag/AgCl, and suitable chemical solution supplying units can be selected for the chemical solution supplying units 6 and 7 according to the purpose. The chemical solution supplying units 6 and 7 are, for example, constructed of a first chemical solution supplier 6 configured to supply a first chemical solution (capable of adjusting not only the oxidation-reduction potential but also the concentration and the pH) having the same components as those of a polishing liquid to a polishing liquid in the polishing liquid vessel 1 when the oxidation-reduction potential (ORP) of the polishing liquid in the polishing liquid vessel 1 measured by the first sensor 4 is outside the range of 400 mV to 700 mV vs. Ag/AgCl, and a second chemical solution supplier 7 configured to supply a second chemical solution (which may contain a surfactant and a catalyst that help improve polishing ability) containing at least one of a sulfur compound and an iron compound to the interconnect material on the wafer 2 when the oxidation-reduction potential (ORP) of a polishing liquid in the polishing liquid collecting container 9 measured by the second sensor 5 is outside the range of 400 mV to 700 mV vs. Ag/AgCl.

—Other Units—

Examples of the aforesaid other units include the chemical solution supply controlling unit 8 configured to control the amount of chemical solutions supplied by the chemical solution supplying units 6 and 7 such that the oxidation-reduction potential (ORP) of polishing liquids is in the range of 400 mV to 700 mV vs. Ag/AgCl, the polishing liquid collecting container 9 configured to collect a polishing liquid after used for chemical-mechanical polishing of the interconnect material on the wafer 2, and a discarding (circulating) unit 10 configured to discard the polishing liquid in the polishing liquid collecting container 9 (circulate the polishing liquid in the polishing liquid collecting container 9 to the polishing liquid vessel 1).

—Chemical Solution Supply Controlling Unit—

The chemical solution supply controlling unit 8 is not particularly limited as long as it can control the amount of chemical solutions supplied by the chemical solution supplying units 6 and 7 such that the oxidation-reduction potential (ORP) of polishing liquids is in the range of 400 mV to 700 mV vs. Ag/AgCl, and a suitable chemical solution controlling unit can be selected for the chemical solution supply controlling unit 8 according to the purpose. Connected to the first sensor 4, the second sensor 5, the first chemical solution supplier 6 and the second chemical solution supplier 7, for example, the chemical solution supply controlling unit 8 controls the amount of a first chemical solution supplied to the polishing liquid vessel 1 on the basis of the value of the oxidation-reduction potential (ORP) of a polishing liquid in the polishing liquid vessel 1 measured by the first sensor 4 and also controls the amount of a second chemical solution supplied to the interconnect material on the wafer 2 on the basis of the value of the oxidation-reduction potential (ORP) of a polishing liquid in the polishing liquid collecting container 9 measured by the second sensor 5.

EXAMPLES

The following explains examples of the present invention; however, it should be noted that the present invention is not confined to these examples in any way.

Example 1

Production of Cu Deposition Sample

Figure 6:
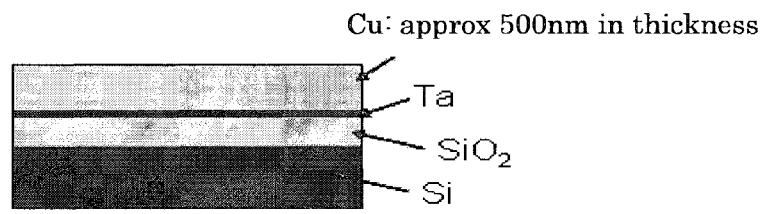
FIG. 6 is a schematic explanatory diagram showing the structure of a Cu deposition sample used in an immersion experiment.

As shown in FIG. 6, an $SiO_2$ film and a Ta film (equivalent to a barrier metal) were formed on an Si wafer, and Cu (equivalent to an interconnect material) was deposited thereupon by 500 nm; a Cu deposition sample was thus produced.

—Preparation of Slurry—

As slurries, a slurry 1 containing 3% by mass of triammonium citrate as a dissolving agent (complexing agent) and containing 6% by mass of hydrogen peroxide ($H_2O_2$) as an oxidant, and a slurry 2 containing 3% by mass of triammonium citrate as a dissolving agent (complexing agent) and containing 6% by mass of ammonium persulfate (APS) as an oxidant were prepared. Additionally, the pH of thus prepared slurries was adjusted using $H_2SO_4$ and KOH.

—Immersion Experiment—

Figure 7:
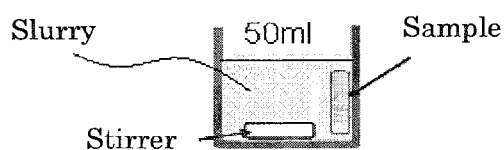
FIG. 7 is an explanatory diagram of an immersion experiment.

As shown in FIG. 7, the Cu deposition sample produced as described above was immersed in the slurries 1 and 2 in beakers for 30 sec and 60 sec respectively, and a current speed of 150 rpm was added by rotating stirrers put into the beakers.

Figure 8:
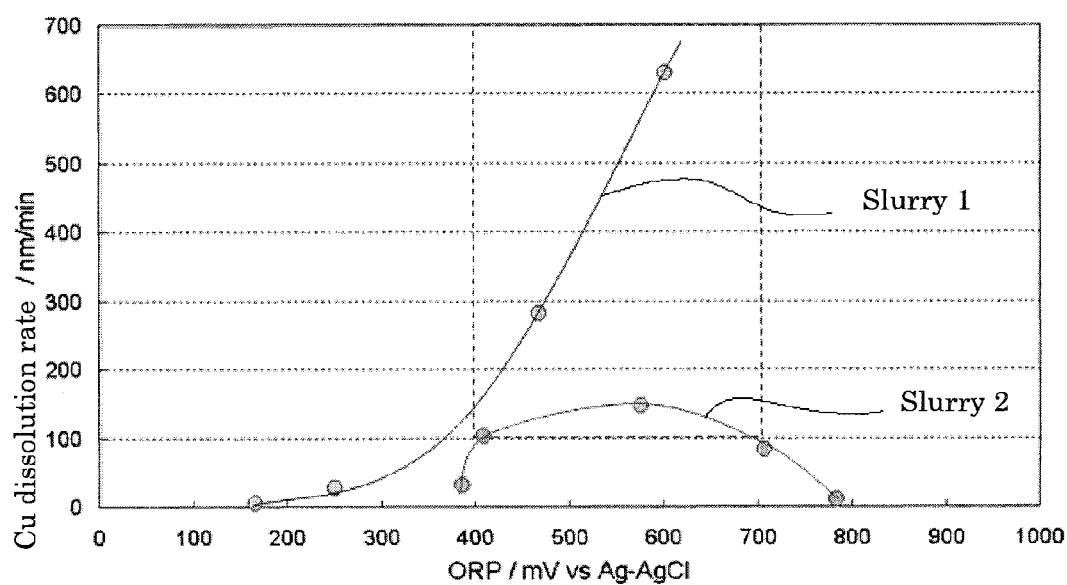
FIG. 8 is a graph showing the relationship between the oxidation-reduction potential (ORP) of slurries and the Cu film dissolution rate.
Figure 9:
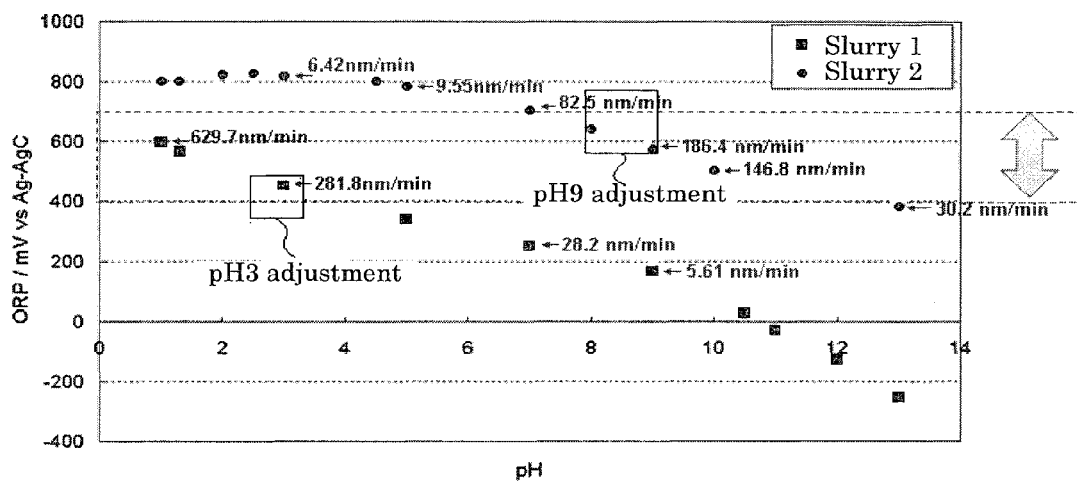
FIG. 9 is a graph showing the relationship between the pH and oxidation-reduction potential (ORP) of slurries.

The thickness of the Cu film after this immersion was measured, and so the dissolution rate thereof was calculated. The results are shown in FIGS. 8 and 9. Immersion experiment was carried out on the slurries 1 and 2 ten times each, and the pH and oxidation-reduction potential (ORP) of the slurries 1 and 2 before and after immersion were measured. The results are shown in Table 1. Note that in Table 1, "Initial" relates to the slurries 1 and 2 before immersion, and "1 to 10" relate to the slurries 1 and 2 after immersion.

TABLE 1

|  | Slurry 1 (pH 3 Adjustment) | | Slurry 2 (pH 9 Adjustment) | |
| --- | --- | --- | --- | --- |
|  | pH | ORP | pH | ORP |
| Initial | 3.0 | 468 | 9.0 | 577 |
| 1 | 2.8 | 432 | 8.7 | 770 |
| 2 | 3.5 | 411 | 7.9 | 615 |
| 3 | 2.4 | 477 | 8.4 | 715 |
| 4 | 2.9 | 478 | 8.3 | 642 |
| 5 | 3.0 | 455 | 8.6 | 599 |
| 6 | 3.1 | 355 | 8.9 | 628 |
| 7 | 3.2 | 398 | 9.1 | 588 |
| 8 | 2.8 | 442 | 9.0 | 645 |
| 9 | 2.7 | 448 | 8.6 | 702 |
| 10 | 2.9 | 468 | 8.7 | 718 |

FIG. 8 is a graph showing the relationship between the oxidation-reduction potential (ORP) of slurries and the Cu film dissolution rate. Note that the vertical axis represents the Cu film dissolution rate (mm/min), and the horizontal axis represents the oxidation-reduction potential (ORP) of the slurries (mV vs. Ag—AgCl).

Judging from FIG. 8, it was found that when the oxidation-reduction potential (ORP) of the slurries 1 and 2 was in the range of 400 mV to 700 mV vs. Ag/AgCl, it was possible to increase the Cu film dissolution rate to 100 nm/min or greater. Importantly, it is obvious that when the Cu film dissolution rate, which consists only of a chemical element in chemical-mechanical polishing, can be increased to 100 nm/min or greater, it is also possible to improve the polishing rate of the chemical-mechanical polishing, in which a mechanical element (e.g. physical polishing by means of abrasive grain) is added to this chemical element.

FIG. 9 is a graph showing the relationship between the pH and oxidation-reduction potential (ORP) of slurries. Note that the vertical axis represents the oxidation-reduction potential (ORP) of the slurries (mV vs. Ag—AgCl), the horizontal axis represents the pH of the slurries, and the numerals in the figure represent the Cu film dissolution rate (mm/min).

Judging from FIG. 9, it was found that when the oxidation-reduction potential (ORP) of the slurries was in the range of 400 mV to 700 mV vs. Ag/AgCl, it was possible to increase the Cu film dissolution rate to 100 nm/min or greater, regardless of the pH values of the slurries.

Also, judging from Table 1, it was found that when a slurry (slurry 1 (pH3 adjustment)) whose oxidation-reduction potential (ORP) was in the vicinity of 400 mV vs. Ag/AgCl or a slurry (slurry 2 (pH9 adjustment)) whose oxidation-reduction potential (ORP) was in the vicinity of 700 mV vs. Ag/AgCl was used for dissolving a Cu film, there was a possibility that the oxidation-reduction potential (ORP) of the slurry after used for dissolving the Cu film might go outside the range of 400 mV to 700 mV vs. Ag/AgCl, and thus it was necessary to control the oxidation-reduction potential (ORP) of the slurry.

Example 2

Reference Slurry

Figure 10:
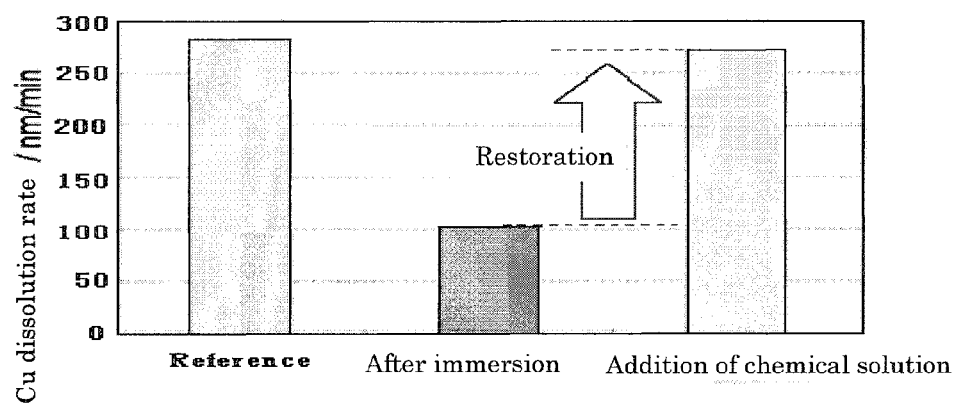
FIG. 10 is a graph showing the Cu film polishing rate of a reference slurry 1, a post-immersion slurry 1 and a chemical solution added slurry 1 in Example 2.

A reference slurry 1 (Initial of the slurry 1 (pH3 adjustment) in Table 1, oxidation-reduction potential (ORP)=468 mV, pH=3.0) was poured into a beaker, and a Cu deposition sample produced in the same manner as in Example 1 was immersed in the reference slurry 1 in the beaker for 30 sec, then a current speed of 150 rpm was added by rotating a stirrer put into the beaker. The thickness of the Cu film after this immersion was measured, and so the Cu film dissolution rate was calculated. The Cu film dissolution rate calculated was 281.8 nm/min. The result is shown in FIG. 10.

—Post-immersion Slurry—

A post-immersion slurry 1 (No. 7 of the slurry 1 (pH3 adjustment) in Table 1, oxidation-reduction potential (ORP)= 398 mV, pH=3.2) in which a Cu deposition sample had earlier been immersed was pored into a beaker, and a Cu deposition sample produced in the same manner as in Example 1 was immersed in the post-immersion slurry 1 in the beaker for 30 sec, then a current speed of 150 rpm was added by rotating a stirrer put into the beaker. The thickness of the Cu film after this immersion was measured, and so the Cu film dissolution rate was calculated. The Cu film dissolution rate calculated was 102.5 nm/min. The result is shown in FIG. 10.

—Chemical Solution Added Slurry—

A chemical solution added slurry 1 was prepared by adding 100 ppm of sodium mercaptopropanesulfonate to the post-immersion slurry 1 (No. 7 of the slurry 1 (pH3 adjustment) in Table 1, oxidation-reduction potential (ORP)=398 mV, pH=3.2). The oxidation-reduction potential (ORP) and pH of this chemical solution added slurry 1 measured were 435 mV and 3.2 respectively.

Further, the chemical solution added slurry 1 (oxidation-reduction potential (ORP)=435 mV, pH=3.2) was pored into a beaker, and a Cu deposition sample produced in the same manner as in Example 1 was immersed in the chemical solution added slurry 1 in the beaker for 30 sec, then a current speed of 150 rpm was added by rotating a stirrer put into the beaker. The thickness of the Cu film after this immersion was measured, and so the Cu film dissolution rate was calculated. The Cu film dissolution rate calculated was 271.2 nm/min. The result is shown in FIG. 10.

Judging from FIG. 10, it was found that the chemical solution added slurry 1 (oxidation-reduction potential (ORP)= 435 mV, pH=3.2) was approximately equal in Cu film dissolution rate to the reference slurry 1 (Initial of the slurry 1 (pH3 adjustment) in Table 1, oxidation-reduction potential (ORP)=468 mV, pH=3.0), and that it was possible to restore the Cu film dissolution rate by adding an appropriate amount of sodium mercaptopropanesulfonate to the post-immersion slurry 1.

Example 3

Reference Slurry

Figure 11:
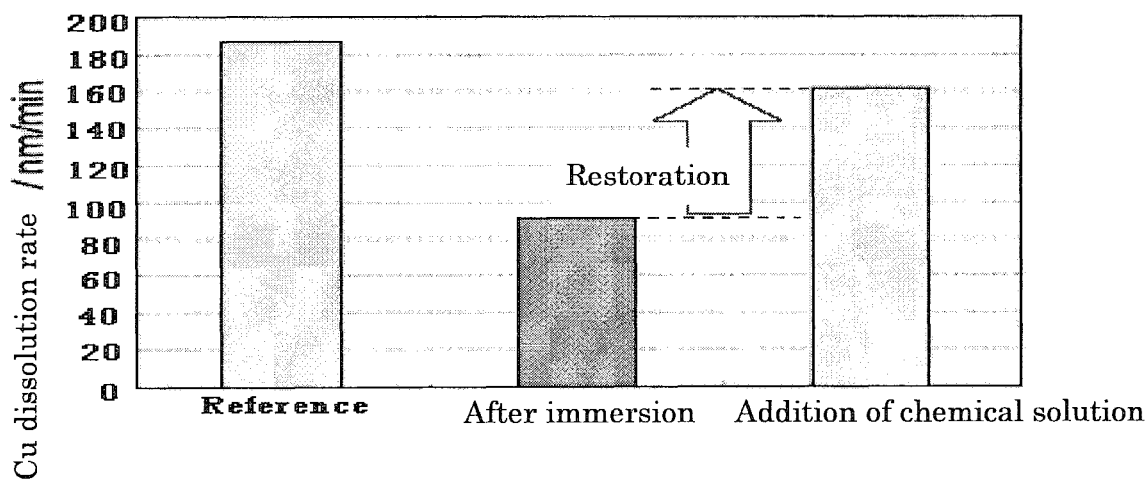
FIG. 11 is a graph showing the Cu film polishing rate of a reference slurry 2, a post-immersion slurry 2 and a chemical solution added slurry 2 in Example 3.

A reference slurry 2 (Initial of the slurry 2 (pH9 adjustment) in Table 1, oxidation-reduction potential (ORP)=577 mV, pH=9.0) was poured into a beaker, and a Cu deposition sample produced in the same manner as in Example 1 was immersed in the reference slurry 2 in the beaker for 60 sec, then a current speed of 150 rpm was added by rotating a stirrer put into the beaker. The thickness of the Cu film after this immersion was measured, and so the Cu film dissolution rate was calculated. The Cu film dissolution rate calculated was 186.4 nm/min. The result is shown in FIG. 11.

—Post-immersion Slurry—

A post-immersion slurry 2 (No. 1 of the slurry 2 (pH9 adjustment) in Table 1, oxidation-reduction potential (ORP)= 770 mV, pH=8.7) in which a Cu deposition sample had earlier been immersed was poured into a beaker, and a Cu deposition sample produced in the same manner as in Example 1 was immersed in the post-immersion slurry 2 in the beaker for 60 sec, then a current speed of 150 rpm was added by rotating a stirrer put into the beaker. The thickness of the Cu film after this immersion was measured, and so the Cu film dissolution rate was calculated. The Cu film dissolution rate calculated was 91.2 nm/min. The result is shown in FIG. 11.

—Chemical Solution Added Slurry—

A chemical solution added slurry 2 was prepared by adding ferric sulfate (Iron (III) sulfate n-hydrate) to the post-immersion slurry 2 (No. 1 of the slurry 2 (pH9 adjustment) in Table 1, oxidation-reduction potential (ORP)=770 mV, pH=8.7) so that the iron ion ($Fe^{3+}$) concentration thereof became 100 ppm. The oxidation-reduction potential (ORP) and pH of this chemical solution added slurry 2 measured were 570 mV and 8.8 respectively.

Further, the chemical solution added slurry 2 (oxidation-reduction potential (ORP)=570 mV, pH=8.8) was poured into a beaker, and a Cu deposition sample produced in the same manner as in Example 1 was immersed in the chemical solution added slurry 2 in the beaker for 60 sec, then a current speed of 150 rpm was added by rotating a stirrer put into the beaker. The thickness of the Cu film after this immersion was measured, and so the Cu film dissolution rate was calculated. The Cu film dissolution rate calculated was 162.3 nm/min. The result is shown in FIG. 11.

Judging from FIG. 11, it was found that the chemical solution added slurry 2 (oxidation-reduction potential (ORP)= 570 mV, pH=8.8) was approximately equal in Cu film dissolution rate to the reference slurry 2 (Initial of the slurry 2 (pH9 adjustment) in Table 1, oxidation-reduction potential (ORP)=577 mV, pH=9.0), and that it was possible to restore the Cu film dissolution rate by adding ferric sulfate (Iron (III) sulfate n-hydrate) to the post-immersion slurry 2 so that the iron ion ($Fe^{3+}$) concentration was appropriate.

The method for manufacturing a semiconductor device and the polisher used in the method for manufacturing a semiconductor device according to the present invention can be suitably used for forming minute interconnections and can be suitably used for forming CMOS-LSI interconnections that are being made minute and high in speed.

The method for manufacturing a semiconductor device and the polisher used in the method for manufacturing a semiconductor device according to the present invention can be suitably used for manufacturing semiconductor devices such as flash memories, DRAMs and FRAMs.

What is claimed is:

1. A method for manufacturing a semiconductor device, comprising:
   depositing an interconnect material including Cu or Cu alloy over an insulating film, and
   polishing the interconnect material by CMP with a polishing liquid,
   wherein oxidation-reduction potential (ORP) of the polishing liquid is controlled so as to be in the range of 400 mV to 700 mV vs. Ag/AgCl,
   wherein the polishing liquid comprises at least one selected from the grow consisting of an oxidant, a dissolving agent, a surfactant, an anticorrosive agent and abrasive grain, and
   wherein the dissolving agent comprises at least one selected from the group consisting of triammonium citrate and malic acid.

2. The method for manufacturing a semiconductor device according to claim 1, further comprising supplying a chemical solution when the oxidation-reduction potential (ORP) of the polishing liquid is outside the range of 400 mV to 700 mV vs. Ag/AgCl.

3. The method for manufacturing a semiconductor device according to claim 1, wherein the oxidation-reduction potential (ORP) of the polishing liquid is measured before and after used for the CMP of the interconnect material.

4. The method for manufacturing a semiconductor device according to claim 1, wherein the oxidant comprises at least one selected from the group consisting of ammonium persulfate (APS) and hydrogen peroxide ($H_2O_2$).

5. The method for manufacturing a semiconductor device according to claim 1, wherein the anticorrosive agent comprises at least one selected from the group consisting of benzotriazole and benzimidazole.

6. The method for manufacturing a semiconductor device according to claim 2, wherein the chemical solution comprises any one of a chemical solution having the same components as those of the polishing liquid, a chemical solution containing a sulfur compound, and a chemical solution containing an iron compound.

7. The method for manufacturing a semiconductor device according to claim 2, wherein in the polishing, a chemical solution containing a sulfur compound is supplied when the oxidation-reduction potential (ORP) of the polishing liquid is less than 400 mV vs. Ag/AgCl.

8. The method for manufacturing a semiconductor device according to claim 2, wherein in the polishing, a chemical solution containing an iron compound is supplied when the oxidation-reduction potential (ORP) of the polishing liquid is greater than 700 mV vs. Ag/AgCl.

9. A polisher polishing an interconnect material including Cu or Cu alloy deposited over an insulating film by CMP with a polishing liquid, comprising:
   a polishing liquid vessel storing the polishing liquid,
   a polishing liquid supplying unit supplying the polishing liquid in the polishing liquid vessel to the interconnect material,
   a measuring unit measuring the oxidation-reduction potential (ORP) of the polishing liquid, and
   a chemical solution supplying unit supplying a chemical solution when the oxidation-reduction potential (ORP) of the polishing liquid measured by the measuring unit is outside the range of 400 mV to 700 mV vs. Ag/AgCl,
   wherein the polishing liquid comprises at least one selected from the group consisting of an oxidant, a dissolving agent, a surfactant, an anticorrosive agent and abrasive grain, and
   wherein the dissolving agent comprises at least one selected from the group consisting of triammonium citrate and malic acid.

10. The polisher according to claim 9, wherein the polishing liquid comprises at least one of ammonium persulfate (APS) and hydrogen peroxide ($H_2O_2$) as an oxidant.

11. The polisher according to claim 9, wherein the chemical solution supplying unit comprises a first chemical solution supplier supplying a first chemical solution to the polishing liquid in the polishing liquid vessel, and a second chemical solution supplier supplying a second chemical solution to the interconnect material.

12. The polisher according to claim 9, further comprising a polishing liquid collecting unit collecting the polishing liquid which has been used for the chemical-mechanical polishing of the interconnect material.

13. The polisher according to claim 11, wherein the first chemical solution has the same components as those of the polishing liquid.

14. The polisher according to claim 11, wherein the second chemical solution comprises at least one selected from the group consisting of a sulfur compound and an iron compound.

15. The polisher according to claim 12, wherein the measuring unit comprises a first sensor measuring the oxidation-reduction potential (ORP) of the polishing liquid in the polishing liquid vessel, and a second sensor configured to measure the oxidation-reduction potential (ORP) of the polishing liquid collected by the polishing liquid collecting unit.

16. The polisher according to claim 12, further comprising a discarding unit discarding the polishing liquid collected by the polishing liquid collecting unit.

17. The polisher according to claim 12, further comprising a circulating unit circulating the polishing liquid collected by the polishing liquid collecting unit to the polishing liquid vessel.

* * * * *